United States Patent
Haugan

(10) Patent No.: US 9,360,292 B2
(45) Date of Patent: Jun. 7, 2016

(54) POSITION MONITORING FOR SUBSEA BELLOW COMPENSATORS

(71) Applicant: Espen Haugan, Trondheim (NO)

(72) Inventor: Espen Haugan, Trondheim (NO)

(73) Assignee: Siemens Aktiengesellschaft, München (DE)

( * ) Notice: Subject to any disclaimer, the term of this patent is extended or adjusted under 35 U.S.C. 154(b) by 0 days.

(21) Appl. No.: 14/397,685

(22) PCT Filed: Apr. 25, 2013

(86) PCT No.: PCT/EP2013/058593
§ 371 (c)(1),
(2) Date: Oct. 29, 2014

(87) PCT Pub. No.: WO2013/164242
PCT Pub. Date: Nov. 7, 2013

(65) Prior Publication Data
US 2015/0132065 A1 May 14, 2015

(30) Foreign Application Priority Data
May 4, 2012 (EP) .................................... 12166856

(51) Int. Cl.
*E21B 41/00* (2006.01)
*H05K 5/06* (2006.01)
*G01L 9/00* (2006.01)
(Continued)

(52) U.S. Cl.
CPC *G01B 5/14* (2013.01); *E02D 29/00* (2013.01); *E02D 29/06* (2013.01); *E21B 33/0355* (2013.01); *E21B 33/0385* (2013.01); *E21B 41/0007* (2013.01); *G01B 7/003* (2013.01); *G01B 11/14* (2013.01); *G01B 21/16* (2013.01); *G01L 9/0033* (2013.01); *H05K 5/067* (2013.01); *H05K 5/068* (2013.01); *G01B 2210/58* (2013.01)

(58) Field of Classification Search
CPC ...... H01F 27/14; H05K 5/068; G01L 9/0033; E21B 41/0007
See application file for complete search history.

(56) References Cited

U.S. PATENT DOCUMENTS 3,552,419 A 1/1971 Weston, Jr.
5,166,677 A 11/1992 Schoenberg
(Continued)

FOREIGN PATENT DOCUMENTS

CH  EP 2169690 A1 * 3/2010 .......... E21B 33/0385
DE  10127276           1/2003
(Continued)

OTHER PUBLICATIONS

International Search Report and Written Opinion cited in PCT/EP2013/058593, mailed May 31, 2013.

*Primary Examiner* — Frederick L Lagman
(74) *Attorney, Agent, or Firm* — Lempia Summerfield Katz LLC

(57) ABSTRACT

An arrangement for providing a variable volume size is described. The arrangement includes an outer bellow having an outer end wall closing the outer bellow at one end. The arrangement further includes an inner bellow having an inner end wall closing the inner bellow at one end, the inner bellow being arranged at least partly inside the outer bellow. The arrangement further includes a base at which another end of the outer bellow and another end of the inner bellow are attached. The arrangement further includes a position measuring apparatus for measuring at least one position indicative of a distance between the outer end wall and the inner end wall.

19 Claims, 4 Drawing Sheets

(51) Int. Cl.
*G01B 5/14* (2006.01)
*E21B 33/035* (2006.01)
*E21B 33/038* (2006.01)
*E02D 29/00* (2006.01)
*E02D 29/09* (2006.01)
*G01B 7/00* (2006.01)
*G01B 11/14* (2006.01)
*G01B 21/16* (2006.01)

(56) References Cited

U.S. PATENT DOCUMENTS

| | | | | |
|---|---|---|---|---|
| 8,549,924 | B2 * | 10/2013 | Virtanen | E21B 33/0385 138/30 |
| 9,038,433 | B2 * | 5/2015 | Skjetne | F16L 55/04 73/1.71 |
| 2012/0291688 | A1 * | 11/2012 | Dawes | B63C 11/00 114/312 |
| 2014/0047925 | A1 * | 2/2014 | Brekke | G01L 7/166 73/774 |
| 2014/0048163 | A1 * | 2/2014 | Brekke | G01L 9/0076 138/30 |
| 2015/0077205 | A1 * | 3/2015 | Boe | E21B 33/0385 336/90 |
| 2015/0188297 | A1 * | 7/2015 | Boe | H01F 27/14 174/564 |

FOREIGN PATENT DOCUMENTS

| | | |
|---|---|---|
| EP | 2221449 | 8/2010 |
| GB | 1463231 | 2/1977 |
| NL | 6904589 | 10/1969 |

* cited by examiner

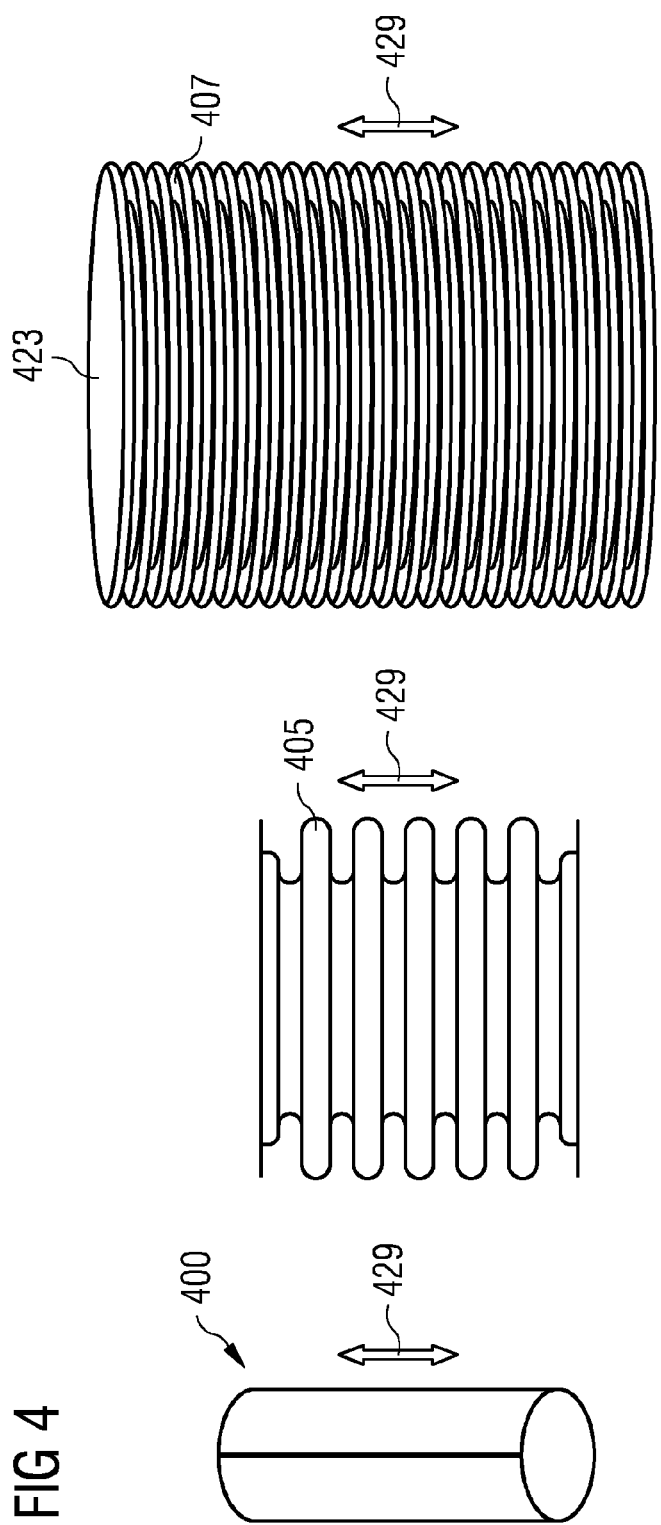

POSITION MONITORING FOR SUBSEA BELLOW COMPENSATORS

CROSS-REFERENCE TO RELATED APPLICATIONS

The present patent document is a §371 nationalization of PCT Application Ser. No. PCT/EP2013/058,593, filed Apr. 25, 2013, designating the United States, which is hereby incorporated by reference, and this patent document also claims the benefit of EP 1,2166856.0, filed on May 4, 2012, which is also hereby incorporated by reference.

TECHNICAL FIELD

The present embodiments relate to an arrangement for providing a variable volume size, to a container including the arrangement for providing a variable volume size, and to a subsea apparatus including the container and an electrical device, in particular variable speed drive.

BACKGROUND

For developing a power grid at the subsea, a number of electronic modules or apparatuses may be provided. The subsea apparatus may include a container that is pressurized in order to withstand the high water pressure below the sea level, such as 2000 m to 4000 m below sea level. The container or enclosure may hold one or more electronic devices, in particular a variable speed drive.

A variable speed drive may be a converter for converting in particular an AC-input power stream to an AC-output power stream, wherein, in particular, the frequency of the AC-output power stream may be controllable by the variable speed drive. Thereby, a number of actuators, such as a pump, a compressor, or the like may be driven by the variable speed drive. The enclosure or container needs to protect the enclosed electronic components or hardware components against the environment, in particular, the salty sea water. Further, the hardware or the electronic devices enclosed in the container may provide cooling during operation. Due to changes in the ambient pressure, in particular, water pressure, and due to changes of the internal temperature, (e.g., during operation of the electronic device), the enclosure may be needed to be volume compensated. Thereby, a volume compensator may be an expandable part of the enclosure that allows the volume to increase/decrease as a function of pressure and/or temperature changes. A bellow structure has been used as a conventional (e.g., volume) compensator for this purpose.

However, it has been observed that the use of a conventional compensator may not in all circumstances allow operation of the subsea apparatus in a reliable manner and may not enable monitoring the correct or saving operation of the subsea apparatus.

There may be a need for an arrangement for providing a variable volume size, for a container including such an arrangement and for a subsea apparatus including such a container, wherein monitoring is improved, thereby allowing to operate the system in a save manner. Further, there may be a need for a subsea apparatus, wherein it is enabled to monitor or detect the correct operation of the subsea apparatus, in particular enabling to detect a failure.

SUMMARY AND DESCRIPTION

The scope of the present invention is defined solely by the appended claims and is not affected to any degree by the statements within this summary. The present embodiments may obviate one or more of the drawbacks or limitations in the related art.

According to an embodiment, an arrangement for providing a variable volume size is described, the arrangement including (1) an outer bellow having an outer end wall closing the outer bellow at one end, (2) an inner bellow having an inner end wall closing the inner bellow at one end, the inner bellow being arranged at least partly inside the outer bellow, (3) a base at which another end of the outer bellow and another end of the inner bellow are attached, and (4) a position measuring apparatus for measuring at least one position indicative of a distance between the outer end wall and the inner end wall.

The volume may change its size due to a changing (in particular hydrostatic) pressure and/or changing temperature inside the outer bellow and/or outside the outer bellow. The outer bellow and/or the inner bellow may be made of a metal, such as steel. The outer bellow may extend along a longitudinal direction that may be perpendicular to the outer end wall. The inner bellow may extend along another longitudinal direction (that may be parallel or may even coincide with the longitudinal direction), which may be perpendicular to the inner end wall. The outer bellow as well as the inner bellow may have a cylindrical shape, wherein the cylinder may have a circular cross-section, in particular, having varying radius varying along the respective longitudinal direction. In particular, the inner bellow may partly or completely be inserted into the outer bellow. The volume size may increase when the outer bellow increases its extent in the longitudinal direction and/or when the inner bellow decreases its extent in the longitudinal direction. Conversely, the volume may decrease when the outer bellow decreases its extent in the longitudinal direction and/or when the inner bellow increases extent in the longitudinal direction.

The base may, in particular, be a portion of a wall of a container that may utilize the arrangement for providing a variable volume size for compensation of volume due to changes of pressure and/or temperature.

The position measuring apparatus may be configured in a number of different manners. The position measuring apparatus is configured to measure the position, wherein based on the position the distance between the outer end wall and the inner end wall may be derivable and/or the size of the volume may be derivable. In particular, when the distance between the outer end wall and the inner end wall increases, the volume size may increase and when the distance between the outer end wall and the inner end wall decreases, the volume size may decrease, in particular, in a linear manner with the decrease of the distance.

During operation an inside of the inner bellow may be filled with surrounding fluid, such as sea water, while a space inside the outer bellow and outside the inner bellow may be filled with a dielectric fluid, (e.g., oil). The outer end wall and/or the inner end wall may change its position, in particular, along the corresponding longitudinal directions, in response to changing temperature (in particular inside the outer bellow and outside the inner bellow) and in response to a changing pressure (in particular outside the outer bellow and inside the inner bellow).

Thus, when measuring the position and/or the distance derived therefrom and/or the volume size the ambient pressure and/or the temperature may be derived therefrom. Thereby, an operation condition or operational state of a device being in communication (in particular via the dielectric fluid) with the arrangement for providing a variable volume size may be derived or determined. Thereby, the operational condition of the associated system or electronic device, (e.g., variable speed drive), may be determined or monitored. Thus, a failure may be detected. Thus, counter measures may be taken, such as by shutting of the system or electronic device or fixing or repairing the electronic device.

According to an embodiment, the position measuring apparatus is arranged within a (e.g., inter bellow) space inside the outer bellow and outside the inner bellow. Thereby, the position measuring apparatus may be protected from exposure to harsh conditions, such as sea water, which may deteriorate the position measuring apparatus. Thereby, save operation or reliable operation of the position measuring apparatus may be improved or provided.

In particular, the position measuring apparatus may be immersed in the dielectric fluid, (e.g., oil).

According to an embodiment, the position measuring apparatus is configured to measure the position (or two or three or four or even more positions) optically (e.g., using electromagnetic radiation, such as infrared light, visible light, ultraviolet light and using one or more optical sensors) and/or inductively (e.g., using one or more coils and one or more conductors moving relative to the coils) and/or mechanically. Thereby, conventional measuring systems may be utilized, thereby simplifying the construction of the arrangement.

According to an embodiment, the position measuring apparatus includes a bar (or stick or rod) and a position measuring sensor for measuring a position of the bar, wherein the position measuring sensor is fixed relative to one of the outer end wall and the inner end wall, wherein the bar moves in correspondence to another one of the outer end wall and the inner end wall, wherein from the position of the bar, the distance is derivable.

The bar may be or include a (e.g., stiff) stick, which may move in correspondence to a relative movement of the outer end wall and the inner end wall. Thus, the position measured by the position measuring sensor may be indicative of the relative position of (thus the distance between) the inner end wall and the outer end wall. The position measuring sensor may be any sensor being configured to measure the position of the bar, such as an optical sensor, an induction sensor or a mechanical sensor.

The position measuring sensor may be either fixed to the outer end wall or to the inner end wall and the bar may move in correspondence or relative to a relative movement or position change of the outer end wall and the inner end wall. According to an embodiment, the distance derived from the position is directly proportional to the position. According to other embodiments the distance may be derived by a linear function depending on the position. In particular, the distance may be derived as a constant term plus the position multiplied by a factor. Thereby, a simple position measuring apparatus may be provided.

According to an embodiment, the arrangement between the bar and the other of the outer end wall and the inner end wall a pulley is arranged, wherein in particular the pulley includes a first roller fixed to the one of the outer end wall and the inner end wall, a second roller fixed to the bar, and a wire fixed at one end of the wire at the other one of the outer end wall and the inner end wall, being lead around the first roller, being lead around the second roller and being fixed at another end of the wire directly or indirectly at the one of the outer end wall and the inner end wall. In particular, the wire is lead around the first roller and the second roller plural times.

The pulley may be provided to configure a measuring range of the position measuring sensor to a relative position change between the outer end wall and the inner end wall. In particular, the relative position change of the outer end wall and the inner end wall may be in a range of for example 50 cm and 200 cm. However, the measurement range of the position measuring sensor may be between 5 cm and 20 cm, in particular around 10 cm. Thus, configuration of the two ranges may be provided. Thereby, the pulley may transform a relatively large change in distance between the outer end wall and the inner end wall to a relatively small change in the positions measured by the position measuring sensor. Thereby, in particular, a reduction factor of five to twenty, in particular, seven to twelve may be achieved. Thereby, it may be enabled to use a conventional position measuring sensor.

The number of times the wire is lead around the first roller and the second roller may define a transformation ratio between a relative position change of the inner end wall and the outer end wall compared to a position change of the bar. Thereby, by selecting an appropriate number leading the wire, the first roller and the second roller may allow to adjust the transformation ratio accordingly, independent of the measuring range of the used position measuring sensor.

The wire may be for example a metal wire. By providing the first roller, the second roller and the wire a simple pulley may be constructed, which may have a reliable operation.

According to an embodiment, the position measuring sensor includes an electric coil in which the bar is movable to induce an electric signal in dependence of the movement or positions of the bar.

The electric coil may be supplied with an electric current in order to generate a magnetic field within the electric coil. The moving bar may induce a voltage in the electric coil that may correspond to the movement of the bar or may correspond to a position change of the bar.

In particular, a movement direction of the bar is perpendicular to a movement direction of the other one of the outer end wall and the inner end wall.

Having the movement direction of the bar perpendicular to a movement direction of the other one of the outer end wall and the inner end wall may reduce a space provided by the position measuring apparatus, thereby increasing the allowed range of relative position change of the outer end wall and the inner end wall.

According to an embodiment, at one end the bar is fixed at the one of the outer end wall and the inner end wall via a spring element, to provide a drawing biasing force to keep the wire tense or wherein at one end the bar a weight is attached, in particular, via another wire redirected by a third roller, to provide a drawing biasing force to keep the wire tense.

It may be necessary to keep the wire tense (such that it is straight between the rollers and between the roller and the respective end wall of the inner bellow or the outer bellow) in order to provide an accurate position measurement. The biasing force may also be provided by applying magnetic and/or electric forces.

According to an embodiment, the position measuring apparatus is configured to detect a first distance and a second distance differing by between 10 cm and 150 cm, in particular between 50 cm and 120 cm, from the first distance, wherein in particular the space is filled with a dielectric fluid, (e.g., oil).

The (e.g., inter bellow) space may be filled with the dielectric fluid in order to provide a good thermal conductor and further also to allow to pressurize the space in order to withstand an ambient pressure, such as pressure of the surrounding sea water.

According to an embodiment, the outer bellow and the inner bellow are flexible to allow change of their extent in a longitudinal direction such that the outer end wall and the inner end wall are independently movable relative to the base to provide the variable volume size in the (e.g., inter bellow)

space inside the outer bellow and outside the inner bellow and/or wherein an inside of the inner bellow is resistant to sea water, wherein an outside of the outer bellow is resistant to sea water.

During operation the inside of the inner bellow may be filled with sea water and the outside of the outer bellow may be exposed to sea water. To a small extent (such as at least 50 to 100 times smaller than the change in the longitudinal direction) the outer bellow and/or the inner bellow may also change in the radial direction (e.g., perpendicular to the longitudinal direction). Thereby, change of the volume side may easily be achievable.

According to an embodiment, the outer bellow and the inner bellow have a wave shape (in particular including plural windings or curvings) in cross-section such that a radius of the bellows changes periodically along the longitudinal direction and/or wherein the outer bellow and the inner bellow are biased such that opposing forces acting towards each other are exerted from the inner end wall and the outer end wall. Thereby, the outer bellow and the inner bellow may be conventional bellows.

According to an embodiment, a container, in particular a subsea container is provided, including an arrangement for providing a variable volume size according to an embodiment as described above and a container wall delimiting a container inner space, wherein the (e.g., inter bellow) space is in fluid communication with the container inner space.

In particular, in the container wall of the container a conduit may be provided, wherein the conduit may be arranged between a connection region, where the outer bellow is connected to the base, and another connection region, where the inner bellow is connected to the base. Thus, in particular, the base at which the inner bellow and the outer bellow are attached may be part of the container wall. The conduit may be closable.

The dielectric fluid, in particular liquid, may conduct heat such that heat generated within the container inner space (e.g., by an electronic device) may be conducted or exchanged towards the (e.g., inner bellow) space thereby influencing the relative positions of the outer bellow and the inner bellow that is measured by the position measuring apparatus.

Further, an outside of the outer bellow may be exposed to the sea water such that changing pressure of the sea water (e.g., when lowering or lifting the container) may affect the position of the outer end wall, which may thus also be monitored by the position measuring apparatus.

According to an embodiment, the space and the container inner space are filled with a dielectric fluid, in particular oil, in particular pressurized to balance a water pressure, in particular corresponding to a depth between 2000 m and 4000 m below sea level.

Thereby, the container may withstand the ambient pressure of the sea water without requiring excessive resistant container walls. Thereby, the thickness of container walls, for example, may be decreased.

According to an embodiment, it is provided a subsea apparatus, including a container according to an embodiment as explained above and an electric device, in particular variable speed drive, in particular AC-AC converter, arranged within the container inner space.

During operation, the electrical device may generate heat that may give rise to a temperature increase within the container inner space, in particular of the dielectric fluid contained in the container inner space. The temperature increase may influence (e.g., increase) the relative position (e.g., distance) between the outer end wall and the inner end wall that is measured by the position measuring apparatus.

Thus, the temperature within the container may be monitored. Thereby, an erroneous operation or a failure of the electrical device may be detected.

According to an embodiment, the subsea apparatus further includes a communication interface for providing a measurement signal, (e.g., at plural consecutive points in time), related to the position measured by the position measuring apparatus to an external processor, wherein from the measurement signal a physical parameter, (e.g., a time course thereof), of the container is derivable, wherein the physical parameter includes a temperature inside the container and/or a pressure inside the container and/or a leakage of fluid contained in the container and/or a change of the position.

The communication interface may include an electric/optical/electronic connector for connecting an electric/optical cable or wire. Alternatively, the communication interface may provide a wireless communication during the subsea apparatus and an external processor or transceiver. The physical parameter derivable from the measurement signal may allow monitoring an operational condition of the subsea apparatus.

BRIEF DESCRIPTION OF THE DRAWINGS

FIG. 4 depicts an embodiment of bellows that may be used in an arrangement for providing a variable volume size.

DETAILED DESCRIPTION

Figure 1:
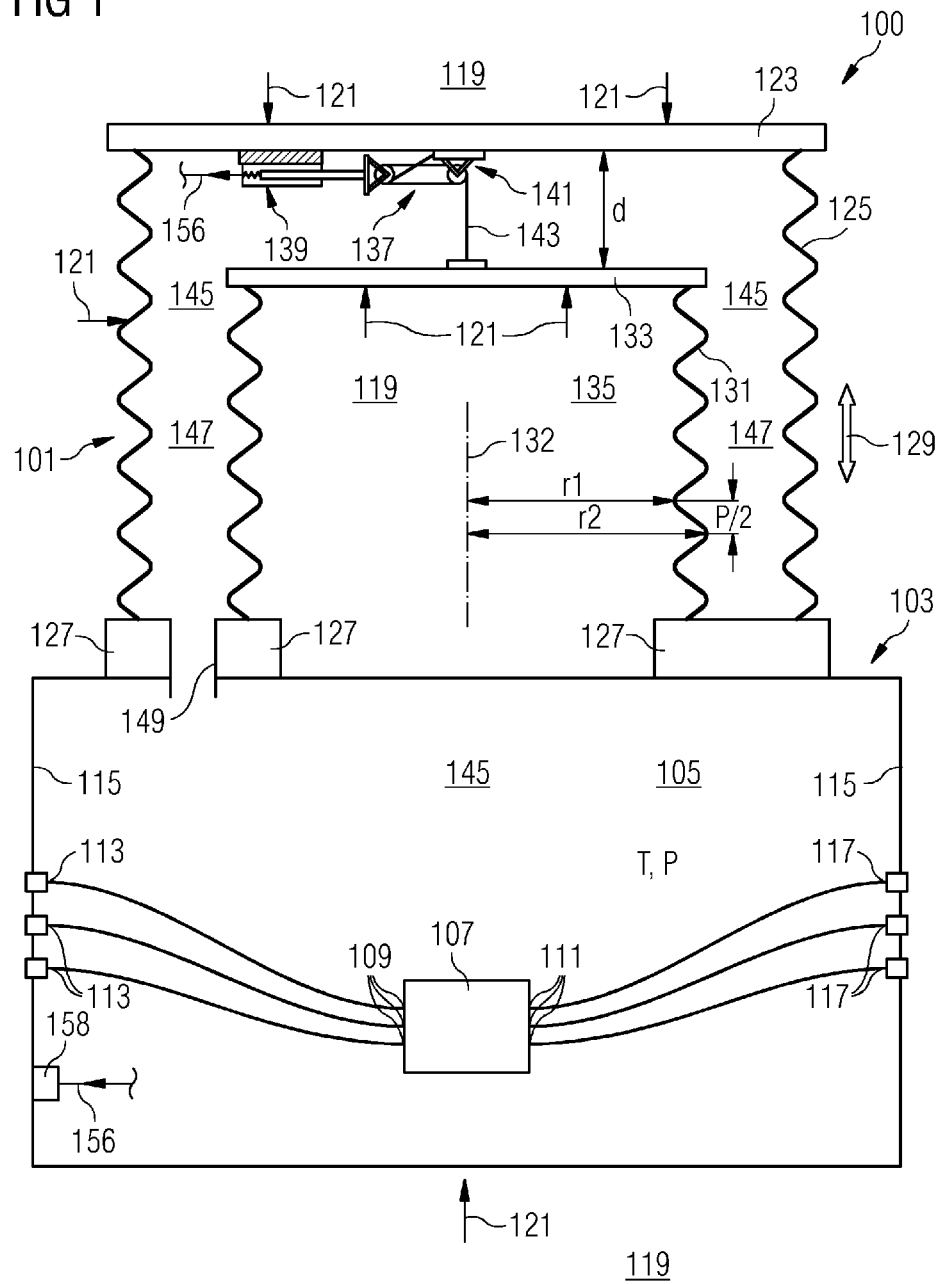
FIG. 1 depicts a cross-sectional view of an embodiment of a subsea apparatus including an arrangement for providing a variable volume size.

The subsea apparatus 100 depicted in FIG. 1 includes an arrangement 101 for providing a variable volume size according to an embodiment, an enclosure 103, wherein the enclosure 103 and the arrangement 101 forms a container according to an embodiment.

The subsea apparatus 100 includes within a container inner space 105 a variable speed drive 107 that, in the illustrated embodiment, is configured as an AC-AC converter for converting a three phase AC input power stream received at input terminals 109 to an AC-output power stream provided at terminals 111. The input terminals 109 are connected to respective connectors 113 at the container wall 115 for connecting power input cables. Further, the output terminals 111 lead to connectors 117 at another side of the container wall 115 for connecting power output cables.

The subsea apparatus may be used below sea level in a depth between 1000 m and 4000 m. Thereby, the subsea apparatus 100 may be immersed in sea water 119. The sea water at this depth exerts a hydrostatic pressure in all directions, as indicated by pressure force arrows 121. In particular, the pressure force 121 acts on an outer end wall 123 of an outer bellow 125 that is attached at a base 127, which in turn is connected to the enclosure or container 103. By exerting the pressure forces 121, the outer end wall 123 may move in a longitudinal direction 129 of the outer bellow 125. The outer bellow is made of a metal sheet having a cylindrical structure that allows movement of the outer end wall 123 along the longitudinal direction 129 to expand or compress the outer bellow 125.

Further, the arrangement 101 for providing a variable volume size includes beside the outer bellow 125 an inner bellow 131 having an inner end wall 133 closing the inner bellow 131 at one end, wherein the inner bellow is arranged at least partly inside the outer bellow 125. The inside 135 of the inner bellow 131 is filled with sea water 119 when the subsea device is used below sea level.

The arrangement 101 for providing a variable volume size further includes a position measuring apparatus 137 including a position measuring sensor 139, a pulley 141 and a wire 143, wherein the wire 143 is attached to the inner end wall 133 and wherein the position measuring sensor 139 is attached to the outer end wall 123. The position measuring apparatus 137 will be described in more detail with reference to FIG. 2 below.

When the variable speed drive 107 arranged in the inside of the container 103 or in an container inner space 105, the variable speed drive 107 may generate heat, which may be transferred to a dielectric fluid 145 with which the container inner space 105 is filled and with which also an inter bellow space 147 between the outer bellow 125 and the inner bellow 131 is filled. A fluid communication conduct 149 is provided between the inter bellow space 147 and the container inner space 105 for allowing the dielectric 145, in particular oil, to exchange between these two spaces. In particular, the dielectric fluid 145 may exchange between the container inner space 105 and the inter bellow space 147 due to change of hydrostatic pressure forces 121 and/or due to change of a temperature T and/or pressure P within the container inner space 105. Thereby, the relative positions of the inner end wall 133 and the outer end wall 123 of the inner bellow 131 and of the outer bellow 125, respectively, may change such that a distance d between the outer end wall 123 and the inner end wall 133 may change. The change of the distance d is measured by the position measuring apparatus 137.

As is depicted in FIG. 1, the inner bellow 131 has a wave shape such that a radius r from a center line 132 varies periodically along the longitudinal direction 129 to alternatingly assume the values r1 and r2, wherein the radius r2 represents the maximal radius and the radius r1 represents the minimal radius. The period p between two adjacent positions along the longitudinal direction 129 at which the radius becomes minimal or maximal depends on an amount how much the inner bellow 131 is compressed or extended in the longitudinal direction 129. Thus, this period p depends on the distance d.

A benefit of the subsea device such as subsea device 100 depicted in FIG. 1 may be that a linear movement of the outer end wall 123 and/or the inner end wall 133 may be long, even though the measurement apparatus 137 occupies little space in between the bellow end walls. In particular, the measurement apparatus 137 is located in the inter bellow space 147 and is in particular immersed into the dielectric fluid 145. If the internal spring 165, as depicted in FIG. 2 as an option or an alternative, is not desired, it may be replaced by the weight 163 and the roller 161.

The measurement signal 156 output by the linear position sensor 139 may be, e.g., via connector 158 at the container wall 115, supplied to an external processor that may derive therefrom the pressure P inside the container 103 and also the temperature T inside the container 103. Based on this information, it may be determined whether the variable speed drive 107 operates properly.

Figure 2:
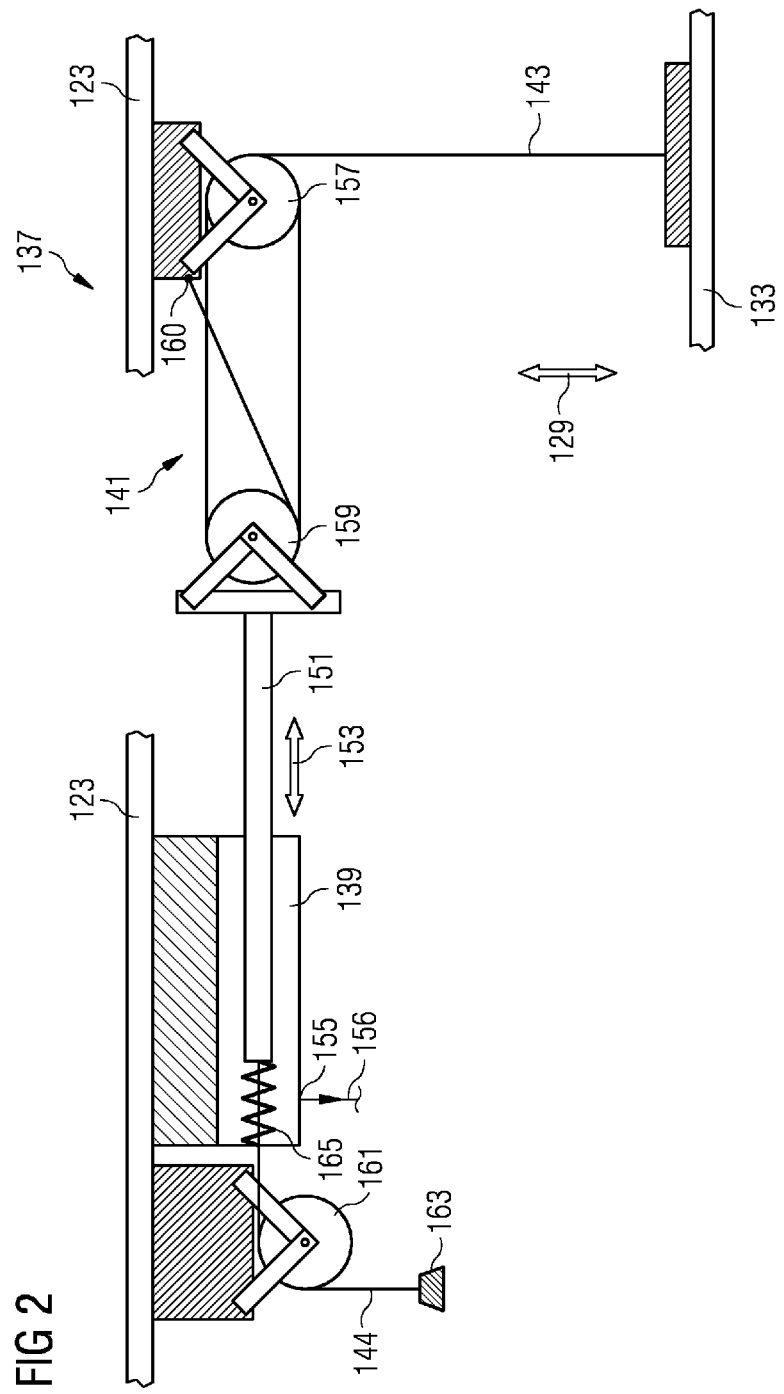
FIG. 2 schematically depicts a position measuring apparatus as used in the arrangement for providing a variable volume size according to an embodiment depicted in FIG. 1.

FIG. 2 schematically depicts the position measuring apparatus 137 that is used within the subsea apparatus 100 depicted in FIG. 1. The position measuring apparatus includes a linear position sensor 139, which is attached to the outer end wall 123 of the outer bellow 125, when used in the arrangement 101 for providing a variable volume size. The linear position sensor 139 includes a coil through which an electric current is provided. A rod or bar 151 is slidable within the coil in the direction indicated with the double arrow 153, wherein different positions of the rod 151 result in measurement signals 156 indicating the position of the rod 151, which are then output by the linear position sensor 139 at a measurement output terminal 155. From a measurement signal 156 supplied or output by the linear position sensor 139, the distance d between the outer end wall 123 and the inner end wall 133 may be derived.

The bar 151 is connected to a pulley 141, wherein the pulley includes a first roller 157, which is fixed to the outer end wall 123, a second roller 159, which is fixed to the bar 151 (but not fixed to the outer end wall 123) and a wire 143 fixed at one end of the wire 143 to the inner end wall 133 of the inner bellow. Further, the wire is lead around the first roller 157, lead around the second roller 159 and is fixed at a position 160 to the outer end wall 123 of the outer bellow 125.

The position measuring apparatus 137 further includes a third roller 161 also attached to the outer end wall 123, wherein around the third roller 161 another wire 144 is lead.

The other wire 144 is at one end fixed at the rod 151 and at its other end has a weight 163 attached to provide a drawing force such that the wires 143 and 144 are tensed to provide a particular biasing tension to avoid that the wire 143 loosens that may impair the position measurement.

Instead or additionally to the biasing force provided by the weight 163, a spring 165 may be attached to an end of the wire 144.

Figure 3:
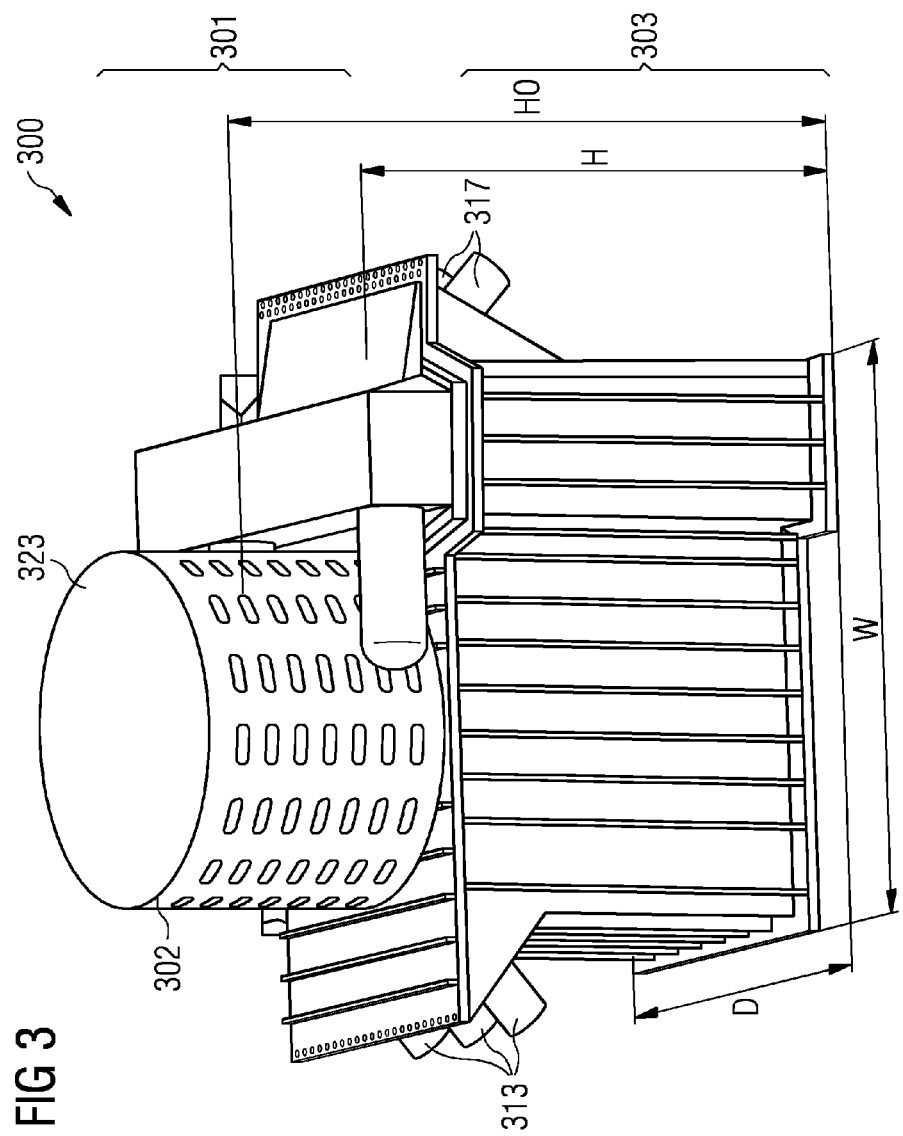
FIG. 3 depicts a perspective view of an embodiment of a subsea apparatus.

FIG. 3 illustrates a perspective view of a subsea apparatus 300 according to an embodiment. The subsea apparatus 300 may include the position measuring apparatus 137 depicted in FIG. 2 and may also include the arrangement for providing a variable volume size 101 as is depicted in FIG. 1.

The subsea apparatus 300 includes an arrangement 301 for providing a variable volume size and a container 303 containing an electronic device, such as a variable speed drive, as is depicted with reference number 107 in FIG. 1.

The width W of the apparatus 300 may amount to between 2500 mm and 3500 mm, the depth D, (e.g., the overall depth D), may amount to between 1500 mm and 3000 mm, the height H of the container 303 may amount to between 2500 mm and 3500 mm, and the overall height HO of the apparatus 300 may amount to between 2500 mm and 4500 mm. The apparatus includes input terminals 313 for supplying an AC input power stream. Further, the apparatus 300 includes three output terminals 317 for outputting an AC power stream having a predetermined or controllable frequency and/or voltage and/or current. The arrangement 301 for providing a variable volume size includes a protection cylinder 302 in which the outer bellow, such as the outer bellow 125 as depicted in FIG. 1, is arranged. The outer bellow is at one end closed by the outer end wall 323 that is exposed to the ambient sea water.

FIG. 4 depicts examples of bellows. A tube 400 may be made of a metal in order to form a cylindrical structure. The cylindrical tube 400 may be bent to obtain a bellow 405 as depicted in FIG. 4 in a side view. The bellow 405 may, for example, be used as an outer bellow or an inner bellow. FIG. 4 also indicates with reference sign 407 a bellow in a perspective view having an end wall 423 closing the bellow 407 at a longitudinal end, wherein the longitudinal direction 429 is indicated.

It should be noted that the term "comprising" does not exclude other elements or acts and "a" or "an" does not exclude a plurality. Also elements described in association with different embodiments may be combined. It should also be noted that reference signs in the claims should not be construed as limiting the scope of the claims.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present invention has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. An arrangement of a subsea apparatus for providing a variable volume size, the arrangement comprising:
    an outer bellow having an outer end wall closing the outer bellow at one end;
    an inner bellow having an inner end wall closing the inner bellow at one end, the inner bellow being arranged at least partly inside the outer bellow;
    a base at which another end of the outer bellow and another end of the inner bellow are attached; and
    a position measuring apparatus arranged within a space inside the outer bellow and outside the inner bellow, wherein the position measuring apparatus is configured for measuring at least one position indicative of a distance between the outer end wall and the inner end wall, and
    wherein an operation condition of the subsea apparatus is derivable from the measured position.

2. The arrangement as claimed in claim 1, wherein the position measuring apparatus is configured to measure the position optically, inductively, mechanically, or a combination thereof.

3. The arrangement as claimed in claim 1, wherein the position measuring apparatus comprises:
    a bar;
    a position measuring sensor for measuring a position of the bar;
    wherein the position measuring sensor is fixed relative to one of the outer end wall and the inner end wall,
    wherein the bar moves in correspondence to another one of the outer end wall and the inner end wall,
    wherein from the position of the bar, the distance is derivable.

4. The arrangement as claimed in claim 3, wherein between the bar and the other one of the outer end wall and the inner end wall a pulley is arranged.

5. The arrangement as claimed in claim 4, wherein the pulley comprises:
    a first roller fixed to the one of the outer end wall and the inner end wall;
    a second roller fixed to the bar; and
    a wire fixed at one end of the wire at the other one of the outer end wall and the inner end wall, being lead around the first roller, being lead around the second roller and being fixed at another end of the wire directly or indirectly at the one of the outer end wall and the inner end wall,
    wherein the wire is lead around the first roller and the second roller plural times.

6. The arrangement as claimed in claim 3, wherein the position measuring sensor comprises an electric coil in which the bar is movable to induce an electric signal in dependence of the movement of the bar.

7. The arrangement as claimed in claim 6, wherein a movement direction of the bar is perpendicular to a movement direction of the other one of the outer end wall and the inner end wall.

8. The arrangement as claimed in claim 3, wherein, at one end, the bar is fixed at the one of the outer end wall and the inner end wall via a spring element to provide a drawing biasing force to keep a wire tense, or
    wherein at one end the bar a weight is attached via another wire redirected by a third roller to provide a drawing biasing force to keep the wire tense.

9. The arrangement as claimed in claim 1, wherein the position measuring apparatus is configured to detect a first distance and a second distance differing by between 10 cm and 150 cm from the first distance.

10. The arrangement as claimed in claim 1, wherein the outer bellow and the inner bellow are flexible to allow change of extent in a longitudinal direction such that the outer end wall and the inner end wall are independently movable relative to the base to provide the variable volume size in the space inside the outer bellow and outside the inner bellow, or
    wherein an inside of the inner bellow is resistant to sea water and an outside of the outer bellow is resistant to sea water.

11. The arrangement as claimed in claim 1, wherein the outer bellow and the inner bellow have a wave shape in cross-section such that a radius of the bellows changes periodically along the longitudinal direction, or
    wherein the outer bellow and the inner bellow are biased such that opposing forces acting towards each other are exerted from the inner end wall and the outer end wall.

12. The arrangement as claimed in claim 1, wherein the space is filled with a dielectric fluid.

13. A subsea container of a subsea apparatus, the subsea container comprising:
    an arrangement for providing a variable volume size, the arrangement comprising:
        an outer bellow having an outer end wall closing the outer bellow at one end;
        an inner bellow having an inner end wall closing the inner bellow at one end, the inner bellow being arranged at least partly inside the outer bellow;
        a base at which another end of the outer bellow and another end of the inner bellow are attached; and
        a position measuring apparatus arranged within a space inside the outer bellow and outside the inner bellow, the position measuring apparatus configured for measuring at least one position indicative of a distance between the outer end wall and the inner end wall; and
    a container wall delimiting a container inner space, wherein the space is in fluid communication with the container inner space,
    wherein the base of the arrangement is connected to the container wall, and
    wherein an operation condition of the subsea apparatus is derivable from the measured position.

14. The container as claimed in claim 13, wherein the space and the container inner space are filled with a dielectric fluid.

15. The container as claimed in claim 14, wherein the dielectric fluid is an oil pressurized to balance a hydrostatic pressure corresponding to a depth between 2000 m and 4000 m below sea level.

16. A subsea apparatus comprising:
a container and an electrical device, the container comprising:
an arrangement for providing a variable volume size, the arrangement comprising:
an outer bellow having an outer end wall closing the outer bellow at one end;
an inner bellow having an inner end wall closing the inner bellow at one end, the inner bellow being arranged at least partly inside the outer bellow;
a base at which another end of the outer bellow and another end of the inner bellow are attached; and
a position measuring apparatus arranged within a space inside the outer bellow and outside the inner bellow, the position measuring apparatus configured for measuring at least one position indicative of a distance between the outer end wall and the inner end wall; and
a container wall delimiting a container inner space, wherein the space is in fluid communication with the container inner space,
wherein the base of the arrangement is connected to the container wall,
wherein the electrical device is arranged within the container inner space, and
wherein an operation condition of the subsea apparatus is derivable from the measured position.

17. The subsea apparatus as claimed in claim 16, further comprising:
a communication interface for providing a measurement signal related to the position measured by the position measuring apparatus to an external processor,
wherein from the measurement signal, a physical parameter of the container is derivable,
wherein the physical parameter comprises (1) a temperature, a pressure, or a temperature and a pressure inside the container, (2) a leakage or fluid contained in the container, (3) a change of the position, or a combination thereof.

18. The subsea apparatus as claimed in claim 17, wherein the communication interface provides the measurement signal at plural consecutive points in time.

19. The subsea apparatus as claimed in claim 16, wherein the electrical device is a variable speed drive or an AC-AC converter.

* * * * *